United States Patent
Kaeppeler

(10) Patent No.: US 6,983,620 B2
(45) Date of Patent: Jan. 10, 2006

(54) METHOD AND DEVICE FOR THE TEMPERATURE CONTROL OF SURFACE TEMPERATURES OF SUBSTRATES IN A CVD REACTOR

(75) Inventor: Johannes Kaeppeler, Würselen (DE)

(73) Assignee: Aixtron AG, (DE)

( * ) Notice: Subject to any disclaimer, the term of this patent is extended or adjusted under 35 U.S.C. 154(b) by 0 days.

(21) Appl. No.: 11/051,748

(22) Filed: Feb. 4, 2005

(65) Prior Publication Data

US 2005/0132954 A1    Jun. 23, 2005

Related U.S. Application Data

(60) Division of application No. 10/436,316, filed on May 12, 2003, now Pat. No. 6,878,395, which is a continuation of application No. PCT/EP01/12310, filed on Oct. 25, 2001.

(30) Foreign Application Priority Data

Nov. 11, 2000  (DE) ................. 100 56 029

(51) Int. Cl.
    *F25D 23/12*    (2006.01)
    *C23C 16/00*    (2006.01)
    *F27B 7/00*     (2006.01)

(52) U.S. Cl. ............... 62/259.2; 427/248.1; 118/725; 219/389; 219/390

(58) Field of Classification Search ............ 62/259.2; 427/8, 248.1, 255; 118/715, 730, 725, 728; 219/389, 390; 34/92, 233, 232; 165/281; 117/89

See application file for complete search history.

(56) References Cited

U.S. PATENT DOCUMENTS

| | | | | |
|---|---|---|---|---|
| 4,860,687 A | * | 8/1989 | Frijlink | 118/500 |
| 5,177,878 A | * | 1/1993 | Visser | 34/92 |
| 5,549,756 A | * | 8/1996 | Sorensen et al. | 118/715 |
| 5,788,777 A | * | 8/1998 | Burk, Jr. | 118/730 |
| 6,005,226 A | * | 12/1999 | Aschner et al. | 219/390 |

FOREIGN PATENT DOCUMENTS

| | | |
|---|---|---|
| DE | 19855637 A1 * | 6/2000 |
| WO | WO 9013687 A3 * | 12/1990 |
| WO | WO 9851843 A1 * | 11/1998 |

\* cited by examiner

*Primary Examiner*—Chen Wen Jiang
(74) *Attorney, Agent, or Firm*—St. Onge Steward Johnston & Reens LLC

(57) ABSTRACT

The invention relates to a method for controlling the surface temperatures of substrates arranged on substrate supports borne by a substrate support carrier on dynamic gas cushions in a processing chamber of a CVD-reactor. The aim of the invention is to reduce or adjust the temperature variations. According to the invention, an average surface temperature value is calculated, being measured in a particularly optical manner, and the level of the gas cushions is regulated by varying the individually controlled gas flow producing the gas cushions in such a way that the variations of the measured surface temperatures in relation to the average value lies within a predetermined temperature window.

6 Claims, 3 Drawing Sheets

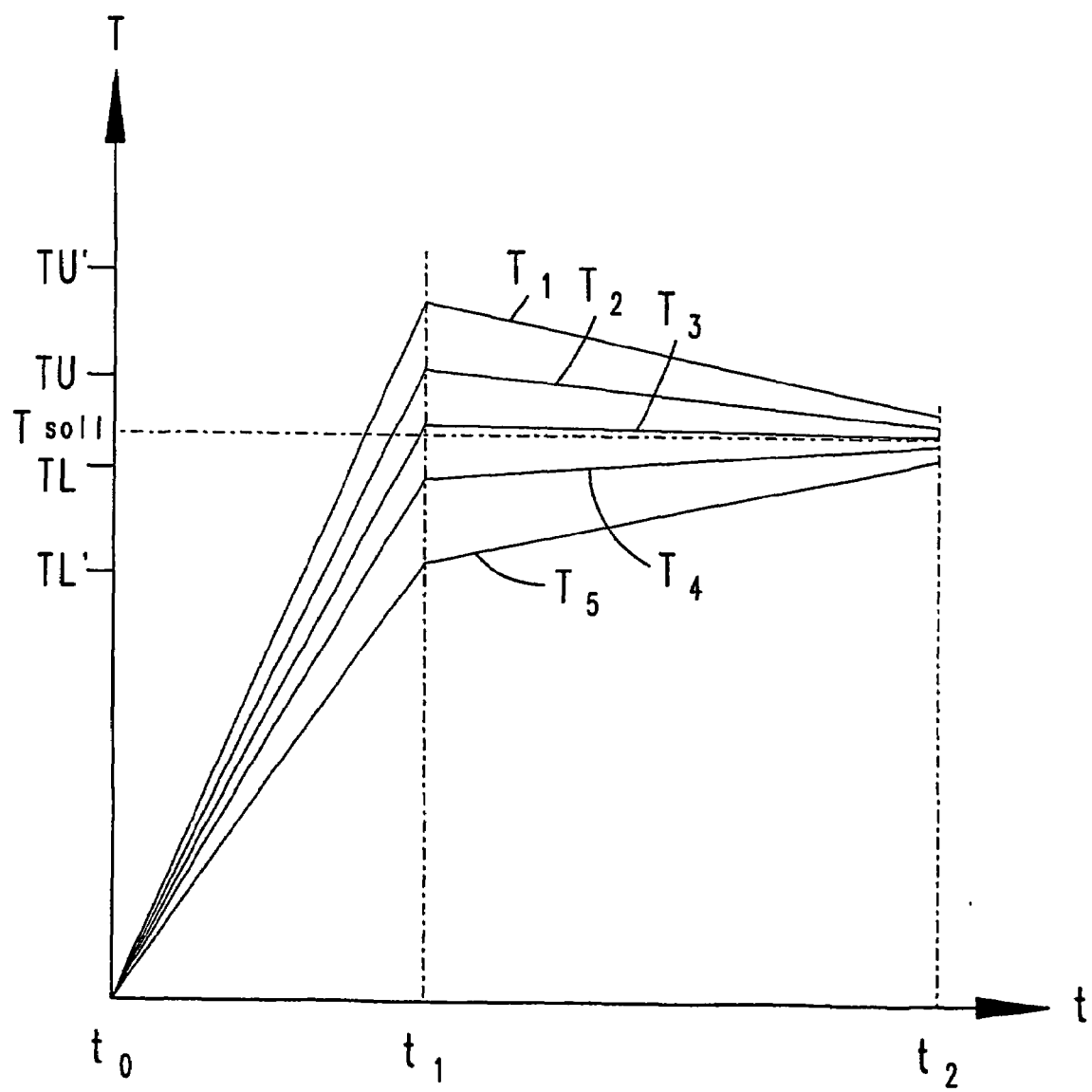

METHOD AND DEVICE FOR THE TEMPERATURE CONTROL OF SURFACE TEMPERATURES OF SUBSTRATES IN A CVD REACTOR

This is a divisional application of pending application Ser. No. 10/436,316 filed May 12, 2003, now U.S. Pat. No. 6,878,395 which is a continuation of International Patent Application No. PCT/EP01/12310 filed Oct. 25, 2001, which designates the United States and claims priority of pending German Application No. 100 56 029.6, filed Nov. 11, 2000.

FIELD OF THE INVENTION

The invention relates to a method and device for the temperature control of the surface temperatures of substrates which are located in a process chamber of a CVD reactor on substrate holders carried on dynamic gas cushions by a substrate holder carrier.

The invention also relates to a CVD reactor having a multiplicity of substrate holders carried on dynamic gas cushions on a substrate holder carrier.

A CVD reactor of the generic type and a method of the generic type are shown in DE 198 55 637 A1.

In known CVD reactors, as are used, for example, to deposit III-V semiconductor layers on III-V substrates, the substrates lie on substrate holders which are in the form of cylindrical disks. These substrate holders are in a satellite-like formation in cutouts disposed on a substrate holder carrier, where they are mounted rotatably by means of a gas cushion. In a CVD reactor of this type, it is not only possible for the substrate holders to rotate relative to the substrate holder carrier. It is also provided that the substrate holder carrier itself rotates about its axis.

The substrate holder carrier, like the individual substrate holders, consists of graphite. For manufacturing reasons, the graphite has inhomogeneities. Furthermore, the heights of the individual gas cushions deviate from one another. The substrate holder carrier is heated from below by means of a high-frequency heater. The inhomogeneities and the different heights of the air cushions lead to different levels of heat transfer to the substrates, which manifests itself in different substrate surface temperatures. The substrate surface temperatures of the substrates lying in a process chamber may differ from one another by a few degrees. Different types of substrates, which differ, for example, in terms of their thickness or back-surface polishing, can lead to different levels of heat transfer from the substrate holder to the substrate and can therefore influence the substrate temperature. The deviations between the temperatures of the individual substrates can be minimized to approx. 1–2 degrees by suitable monitoring and selection of the parameters, such as for example materials, weight, thicknesses, etc.

For some applications which impose special demands on layer thickness and composition, it is necessary to keep the temperature deviations to less than one degree, preferably less than half a degree. Furthermore, it is advantageous to detect and compensate for greater temperature fluctuations between the substrates, for example resulting from undesirable (or desirable) use of substrate holders or substrates of different thicknesses, by means of automatic control, in order in this way to facilitate process monitoring.

Therefore, the invention is based on the object of proposing measures for reducing or evening out the temperature deviation.

The object is achieved by the invention described in the claims. Claim 1 proposes, first of all and substantially, that mean values are formed from the temperatures which are measured in particular optically, and the heights of the gas cushions are adjusted in such a way, through variation of the individually controlled gas streams which generate the gas cushions, that the deviations of the measured surface temperatures from the mean value lie within a predetermined temperature window. It is preferable for the temperature window to be approximately one degree or half a degree. Furthermore, it is possible for the mean value to correspond to the temperature desired value which is to be set. This has the advantage that only minimal deviations in the upward direction and the downward direction are possible. In a refinement of the invention, it is provided that the substrate holders are driven in rotation by the gas stream. Furthermore, the rotational speed can be monitored. For this purpose, it is possible to provide a rotational speed-measuring element which determines the rotational speeds of the individual substrate holders. The rotational speed determination may be carried out successively by a single rotational speed-measuring element which the individual substrate holders move past as a result of the rotation of the substrate holder carrier. The rotational speed of the substrate holders should not fall below a minimum value, so that overall the crystal growth is homogeneous over the entire substrate. The temperature measurement may be carried out through an opening in the process chamber cover. For this purpose, it is possible to provide an optical temperature-measuring element, for example a pyrometer, which is directed through said opening onto the substrate holder carrier from above. The measuring element used may be devices which are able to determine temperature-dependent layer properties, in order thereby to determine the temperature directly or indirectly. By way of example, the temperature-dependent layer growth can be determined by measuring the layer thickness by means of reflection measurements. On account of the rotation of the substrate holder carrier, the individual substrate holders successively move past the temperature-measuring element, so that the temperatures of the individual substrates can be measured in succession. On the substrate holder carrier there may be a suitable mark, which can be checked by a suitable sensor in order to synchronize the angular position of the substrate holder with the measured values supplied by the temperature-measuring element. The process chamber is preferably initially heated up without the gas streams being controlled. The gas streams are kept to predetermined values. These may be empirical values from previous coating steps in which the lowest possible temperature differences were established. Only when the mean value of the measured substrate temperatures has reached in particular a stable desired value, which in particular may correspond to the desired temperature, do the surface temperatures begin to be controlled by variation of the gas cushion height.

The invention also relates to a CVD reactor having a multiplicity of substrate holders carried on a substrate holder carrier by dynamic gas cushions.

According to the invention, the CVD reactor which is known from the prior art is refined by a measuring device, which has at least one temperature-measuring element, for determining the surface temperatures of all the substrates located on the substrate holders, in which there are a temperature-control element and gas mass flow control means which are individually associated with each substrate holder and are actuated by the temperature-control element in such a manner that the substrate temperatures are kept within a predetermined temperature window by variation of the gas cushion heights. In this case too, it is advantageous if the substrate holders are driven in rotation by the gas stream. It is also possible for the substrate holder carrier to be driven in rotation. It is then preferable for a single temperature-measuring element, which is disposed above an opening in the process chamber cover, to be provided. It is possible for a rotational speed-measuring element, which, through windows in the substrate holder carrier, optically scans peripheral surfaces, which are provided with index marks, of the substrate holders, to be provided at the outer periphery of the substrate holder carrier. If there is only a single temperature-measuring element, for example in the form of a pyrometer, the measurement signal supplied by the pyrometer can be fed to a measured value multiplexer. The corresponding measured value can be associated with a substrate on the basis of the sensor-determined rotation-angle position of the substrate holder carrier. These substrate temperatures are fed to a temperature-control element. The latter uses the temperatures to determine a mean value. The relationship of the mean value to the desired temperature is determined. The temperature-control element supplies output signals which are fed to each mass flow control unit, so that each gas stream which forms a gas cushion can be controlled individually. Overall, the control takes place in such a way that the temperature does not drop below a minimum substrate holder rotational speed.

BRIEF DESCRIPTION OF DRAWINGS

An exemplary embodiment of the invention is explained below with reference to appended drawings, in which:

FIG. 4 shows a rough diagrammatic illustration of the temperature/time curve during the heating-up of a CVD reactor and adjustment of the substrate temperatures.

DETAILED DESCRIPTION OF DRAWINGS

Figure 1:
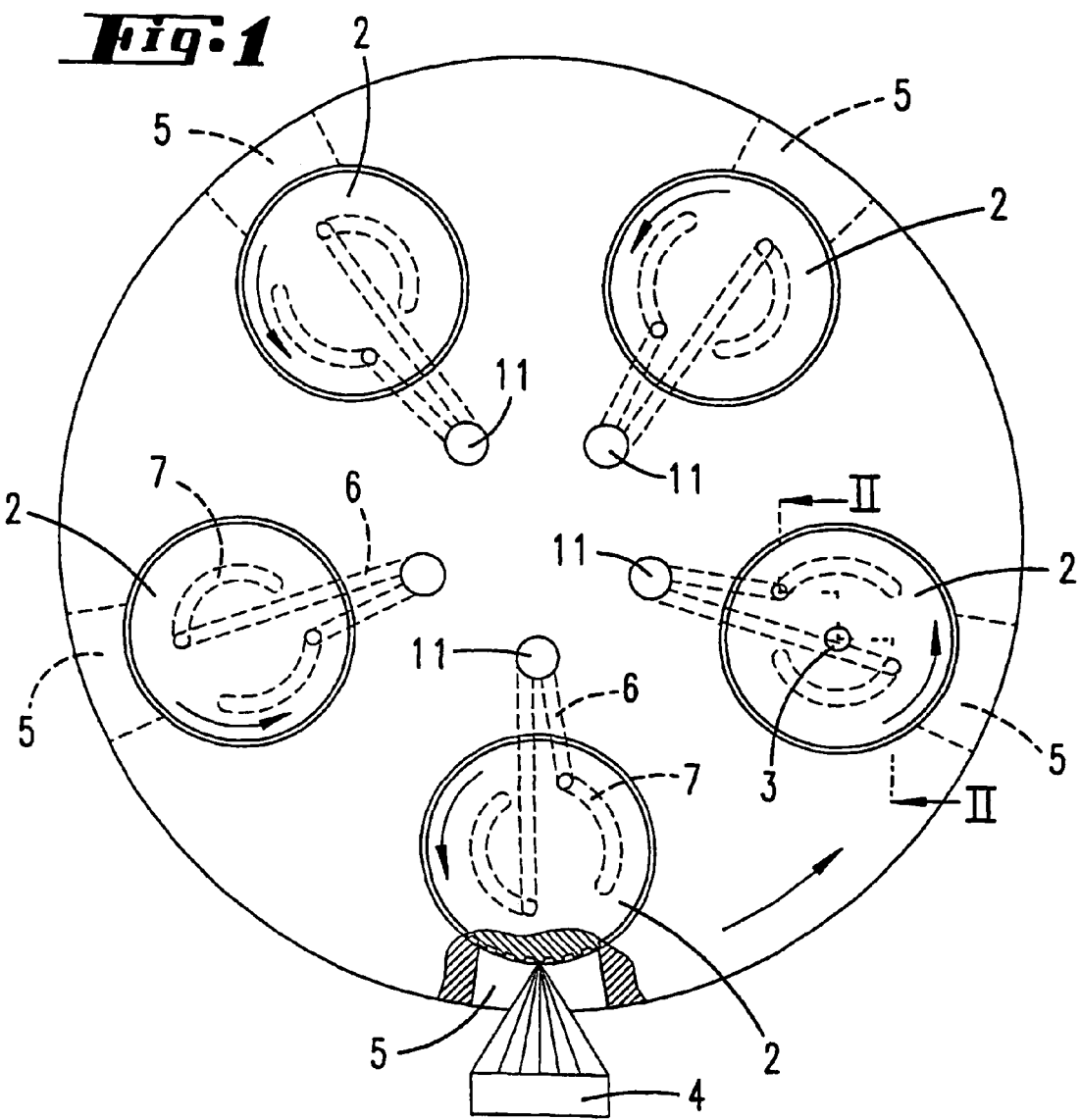
FIG. 1 diagrammatically depicts a plan view of a substrate holder carrier with rotational speed-measuring elements.
Figure 2:
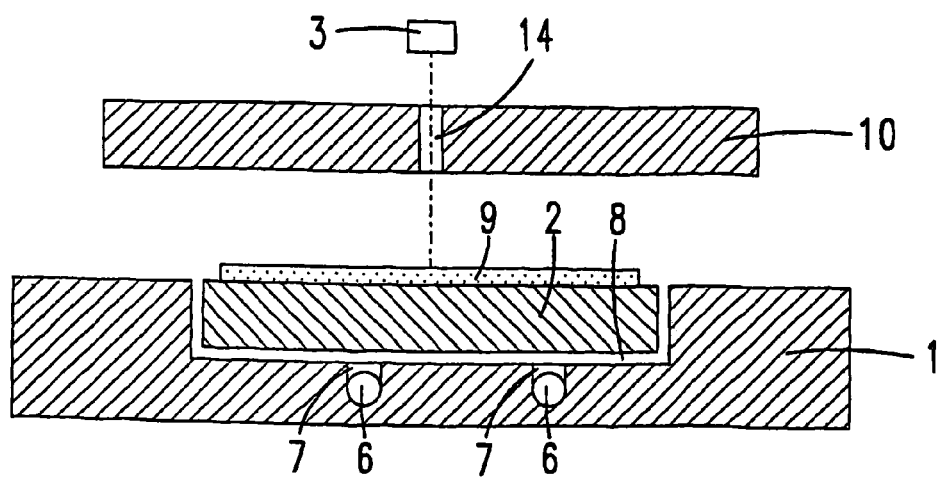
FIG. 2 shows a section on line II-II through a process chamber of a CVD reactor, FIG. 3 diagrammatically depicts the measuring and control elements.
Figure 3:
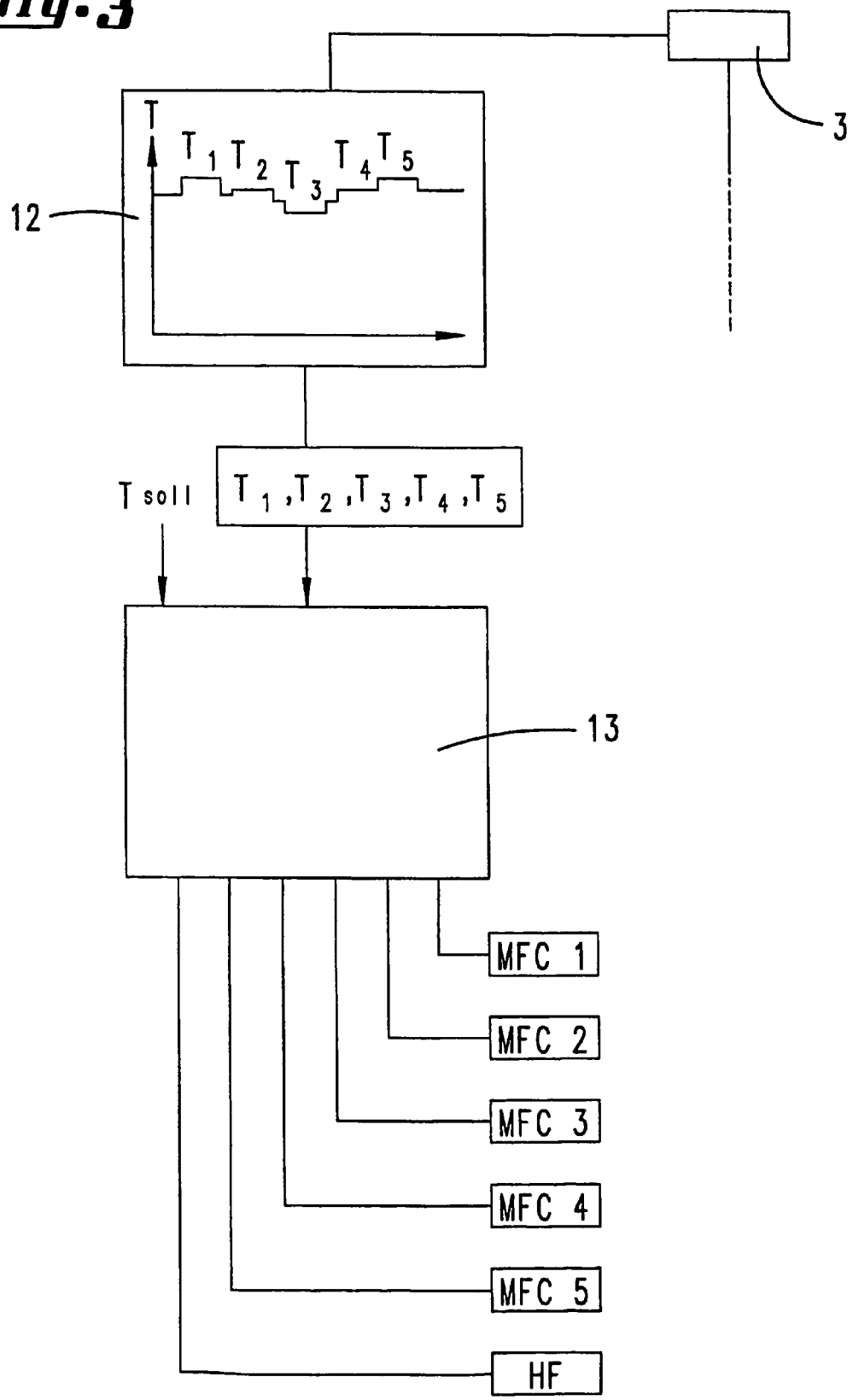

The CVD reactor has a process chamber, which has a base which is formed by a substrate holder carrier 1. The process chamber cover 10 is at a distance from the substrate holder carrier 1 and has an opening 14 which is located approximately at the centers of the substrate holders 2 which are disposed in satellite form on the substrate holder carrier 1.

The substrate holders 2 are in the form of cylindrical disks and are located on a gas cushion 8 which is formed by an individual gas stream being fed through flow passages 6 in each receiving chamber of a substrate holder 2, which gas stream emerges at the base of the cutout through helical grooves 7, in such a manner that the substrate holders 2 are driven in rotation.

The substrate holder carrier 1 is also driven in rotation. The outer wall of the substrate holder carrier 1 has windows 5 which are associated with each substrate holder 2 and through which a rotational-speed measuring element 4 optically scans index marks disposed at the outer periphery of the substrate holder 2, in order to determine the rotational speed of the substrate holders 2.

Associated with each substrate holder 2 there is an individual gas-flow feedline which is controlled by an individual gas mass flow controller MFC1–MFC5.

Above the opening 14 there is a temperature-measuring element 3. This may be a pyrometer. The measured values supplied by the pyrometer 3 are fed to a measured value multiplexer 12. The latter receives, from a rotation angle sensor (not shown in the drawings), information about the current rotation angle of the substrate holder carrier, so that each temperature T1–T5 determined by the temperature-measuring element 3 can be associated with a substrate holder 2 or the substrate 9 located thereon.

These substrate surface temperatures T1–T5 are made available to a temperature-control element 13 as input variables. A further input variable is the temperature desired value Tdes. The temperature-control element 13 uses the substrate surface temperatures T1–T5 to determine a mean value and controls this mean value in such a way that it corresponds to the value Tdes. This is achieved by actuation of the high-frequency heater HF.

In addition, the temperature-control element 13 supplies control values for the individual gas mass flow controllers MFC1–MFC5.

The magnitude of the gas streams flowing through the gas mass flow controllers determines the height of the gas cushion 8 and therefore the heat transfer from the high-frequency heater through the substrate holder carrier and the substrate holder 2 to the substrate 9. The greater the height of the gas cushion 8, the less heat is transferred. To this extent, the surface temperature of the substrates 9 can be influenced by a variation in the gas mass flow. For this purpose, the temperature-control element transmits individual output signals to the individual mass flow controllers MFC1–MFC5.

As illustrated in FIG. 4, the heating-up from t0–t1 initially takes place without control of the gas mass flows. The temperature rise from temperature t0 to temperature t1 is only diagrammatically indicated in that figure. In reality, the ramp flattens out toward the end. As a result, starting substrate surface temperatures T1–T5 are established, these temperatures, after the desired value Tdes has been reached, lying between an upper limit temperature TU' and a lower limit temperature TL'. The control begins at time t1. The result of this is that the temperatures which are below the temperature Tdes rise and the temperatures which are above the temperature Tdes fall until the substrate temperatures T1–T5 are within a window formed by the upper temperature TU and the lower temperature TL. The width of the window corresponds to approximately one degree or half a degree. When the temperatures T1–T5 are within the window TU–TL, time t2 has been reached, at which the coating process can take place in a known way by introduction of the reactive gases.

In a variant, the desired temperature can also be measured separately. It is provided in particular that the controlling of the high-frequency heater to keep the desired temperature constant is effected only by means of the measured value supplied by this measuring element.

In a further variant, it is provided that the desired temperature is altered during the process. Particularly for gallium nitrite technology (cf. DE 197 34 034), it may be necessary to pass through defined temperature ramps. The substrate temperature rises or falls by, for example, 2 degrees per minute. In this case too, it is possible to provide for the high-frequency heater to be actuated via a separate control circuit by means of an individual measured value pick-up in order to pass through the ramp. The gas mass flow controllers are then only used to minimize the deviation of the substrate temperature from the desired temperature, which varies over the course of time. If a single temperature-measuring element is used for a large number of substrates, it records the temperature of each substrate not continuously but rather at intervals. The differential temperature with respect to a calculated desired value, which corresponds to the current time, is then determined. This differential temperature is to be kept as low as possible in accordance with the invention. A corresponding expert system can be used for control purposes.

All features disclosed are (inherently) pertinent to the invention. The disclosure content of the associated/appended priority documents (copy of the prior application) is hereby incorporated in its entirety in the disclosure of the application, partly for the purpose of incorporating features of these documents in claims of the present application.

What is claimed is:

1. A CVD reactor having a multiplicity of substrate holders carried on dynamic gas cushions on a substrate holder carrier, characterized by a measuring device, which has at least one temperature-measuring element, for determining the surface temperatures of all the substrates located on the substrate holders, a temperature-control element and gas mass flow control means which are individually associated with each substrate holder and are actuated by the temperature-control element in such a manner that the substrate temperatures are kept within a predetermined temperature window by variation of the gas cushion height.

2. The CVD reactor according to claim 1 or characterized by substrate holders driven in rotation by the gas stream.

3. The CVD reactor according to claim 1 or characterized by a substrate holder carrier driven in rotation.

4. The CVD reactor according to claim 1 or characterized by a single temperature-measuring element disposed above an opening in the process chamber cover.

5. The CVD reactor according to claim 1 or characterized by a rotational speed-measuring element which is provided at the outer periphery of the substrate holder carrier and, through windows in the substrate holder carrier, optically scans peripheral surfaces, which are provided with index marks, of the substrate holders.

6. The CVD reactor according to claim 1 or characterized by a measured-value multiplexer which is associated with the single temperature-measuring element.

* * * * *